Inventors
Adam Gelbtuch
John Henry Ashby
By
Cushman, Darby & Cushman
Attorneys

MULTISTAGE THERMO-ELECTRIC COOLING DEVICE

Filed May 9, 1963 2 Sheets-Sheet 2

Inventors
Adam Gelbtuch
John Henry Ashby
By
Cushman, Darby & Cushman
Attorneys

United States Patent Office 3,151,465

Patented Oct. 6, 1964

3,151,465

MULTISTAGE THERMO-ELECTRIC COOLING DEVICE

Adam Gelbtuch, London, and John Henry Ashby, Pinner, England, assignors to Frigistor Laboratories Limited, Langley, England Filed May 9, 1963, Ser. No. 279,103
Claims priority, application Great Britain, May 9, 1962, 17,915/62
3 Claims. (Cl. 62—3)

This invention relates to improved multistage thermo-electric cooling devices in which the successive stages produce successively lower temperatures.

It is an object of our invention to produce a multistage thermo-electric cooling device of improved efficiency.

By Peltier cooling unit we intend an arrangement of thermo-electric elements (i.e. blocks of thermo-electric material) alternately of one conductivity type and of the opposite conductivity type connected electrically in series preferably by bridging elements composed of metals of good thermal and electrical conductivity such that the array of thermo-electric elements presents two major surfaces and such that the bridging elements or junctions between adjacent thermo-electric elements are arranged alternately on the one and on the other of the two major surfaces; adjacent thermo-electric elements being of opposite conductivity types. Such cooling units when connected to a suitable source of electrical current become hot on one of the major surfaces and cold on the opposite major surface. The two major surfaces are normally substantially flat and parallel to each other, such an arrangement being referred to herein as a cooling wafer.

In multistage cooling, one unit or group of units, referred to collectively as the first stage, is connected thermally on its hot side to ambient temperature or is cooled on its hot side directly or indirectly by a cooling fluid, normally water, and serves to cool directly or more usually by means of heat transfer means, the hot side or sides of a second wafer or group of wafers referred to collectively as the second stage. The second stage can cool similarly the hot side of a further wafer or group of wafers known collectively as the third stage and so on, if desired, to the fourth and higher stages, each successive stage producing a lower temperature.

According to the invention, there is provided a multistage thermo-electric cooling device comprising on or more higher stage Peltier cooling units (as hereinbefore defined) in good thermal contact with a portion of the surface of a heat transfer block and one or more lower stage Peltier cooling units in good thermal contact with at least 75% of the remainder of the surface of the heat-transfer block, said lower stage unit or units being in contact with a least twice as much of the surface area of the heat transfer block as the or all of the higher stage units.

Preferably the heat transfer block or blocks is or are provided with a least one hole or channel or groove which serves to convey the electrical leads from the external face of the heat transfer block to the higher stages, said higher stages being well thermally insulated from ambient, such that the amount of heat conveyed by the electrical leads to the higher stages is reduced to a minimum. The thermal insulation of the higher stages may be made more effective by placing them in a sealed chamber from which the air is evacuated preferably through a hole or holes in the heat transfer block which may or may not be the same hole or holes used to convey the electrical connections to the higher stages. The heat transfer block or blocks are preferably substantially completely covered by units, the remaining surface serving for electrical connections and for evacuating the air should this be desired, and preferably presenting the minimum free external surface. Such a minimum of exposed surface can be obtained either by shaping the block e.g. by tapering to give one small surface to be exposed or by using a full-sized surface for the electrical leads and pumping but covering those portions of this exposed surface not actually needed for such connection and pumping by a specially shaped wafer or a suitable arrangement of small wafers.

In any case any exposed surface of the heat transfer block is preferably thermally insulated from ambient.

A multistage cooling device in accordance with the invention is illustrated in the accompanying drawings, in which.

Figure 1:
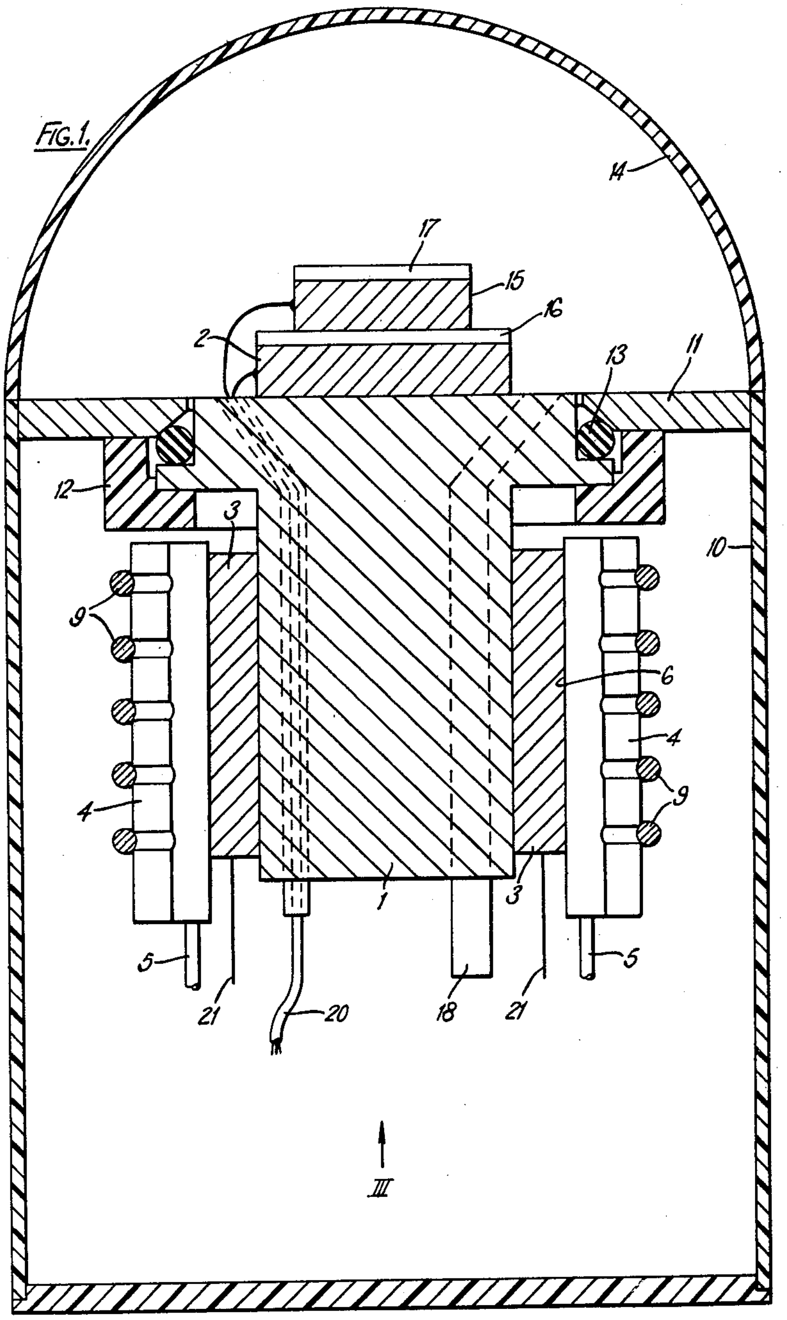
FIGURE 1 is a side view in section of a cooling device.
Figure 2:
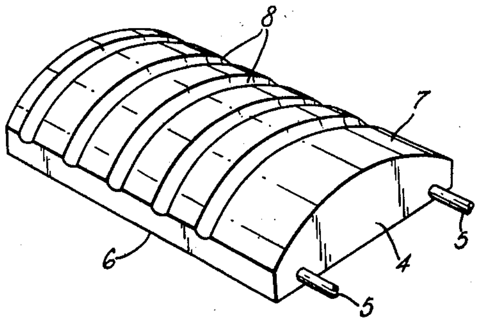
FIGURE 2 is a perspective view of a heat-exchange element or heat sink shown in FIGURE 1; and, FIGURE 3 is a view from below of the device apart from the outer casing.
Figure 3:
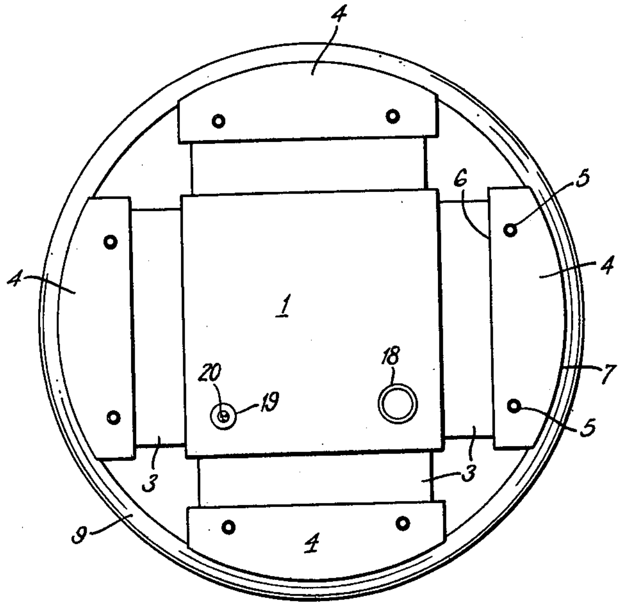

In the illustrated embodiment of the invention a heat transfer block 1 is rectangular i.e. has six rectangular faces, the upper face being in direct thermal contact with the hot side of the second stage wafer 2. Four of the other faces are in direct thermal contact with the cold side of the four first stage wafers 3. The hot sides of the first stage wafers 3 are cooled by heat exchange elements 4 which are water cooled through conduits 5 and which have one flat side 6 placed against the wafers 3 one curved side which is placed outermost such that the curved sides form part of a cylinder and said curved sides being provided with grooves 8 for the reception of garter springs 9 serving to hold the external heat exchange elements 4 and the first stage wafers 3 in position around four sides of the heat transfer block.

The heat exchange block and the components carried thereby are supported in a suitable container 10 on an annular disc 11 by means of methylmethacrylate supports 12 with an O-ring gasket 13 sealing the upper part of the container from the remainder. The second stage wafer 2 is thus positioned in the upper part of the container formed by the dome 14. In the illustrated embodiment a third stage wafer 15 is carried by the single second stage wafer 2, with an intermediate heat exchange block 16, although it is preferred for the third stage to have associated therewith two more second stage wafers. The illustrated example is shown in use with a cold radiation detector 17.

The heat transfer block 1 has a hole 18 through which air may be extracted to evacuate the upper part of the container 10, a further hole 19 being provided for power leads 20 for the second and third stage wafers. The first stage wafers are supplied through power leads 21.

It will be appreciated that the dimensions of the flange by which the block 1 is held on support 12 and which is utilised to maintain sealing gasket 13 against disc 11 have been greatly exaggerated for clarity. In practice the dimensions of this flange will be extremely small so that the surface of the block on which the first stage wafers 3 bear will in fact comprise at least 50% of the surface of the block.

In a further form of the invention a plurality of heat transfer blocks substantially tetrahedral in form are used: one such tetrahedral heat transfer block serves to remove the heat from the hot side of the third stage wafer to the cold side of three second stage wafers while three such heat transfer blocks remove the heat from the hot side of each of the second stage wafers to the cold side of nine first stage wafers. Some at least of the blocks may have one corner of the tetrahedron removed to provide a fifth face for electrical supply.

In yet a further form one heat transfer block is substantially a cube and is used for heat transfer between the third and second stage while 4 or 5 substantially pyramidal heat transfer elements serve for heat transfer between the first and second stages.

In these two forms of the invention a fourth cooling stage thermally connected to the third cooling stage by a conventional heat exchange means may be incorporated. In these cases where the fourth stage is used or in the case of the first embodiment where a third stage is used the general shape of the assembly may well be that of a cube, sphere or squat cylinder having a projection which projection serves as the cold point.

Although in all the described forms the two major surfaces of the unit are flat, the two major surfaces may be cylindrical or substantially cylindrical in shape and lie substantially concentrically one within the other, substantially parallel to each other. Although the cross-section of such an annular cooling unit is normally of the form of concentric circles it is contemplated that the annular cooling unit may be such that it presents an elliptical cross-section. Furthermore, although the annular cooling units previously described have had constant cross-sections, it is possible and in certain respects desirable that the units should present cross-sections of gradually decreasing area, the major surfaces being of the form of the curved surface of a cone or truncated cone.

The surfaces of the heat transfer block will thus be suitably modified, i.e. the block will be cylindrical, conical, frusto-conical, or spherical or elliptical.

The heat transfer block may be hollowed out giving a space containing a heat transfer fluid which absorbs or emits heat in changing from one state to another.

We claim:

1. A multistage thermo-electric cooling device comprising a heat transfer block, a total surface area to said block, at least three substantially flat surfaces together having an area at least 50% of said total surface area, a first stage thermo-electric cooling element associated with each of said flat surfaces, cold junctions to each said element in good thermal contact with the associated flat surface, a further substantially flat surface to said block and a second stage thermo-electric having hot junctions in good thermal contact with said further surface.

2. A multistage thermo-electric cooling device comprising a heat transfer block, six substantially flat faces to said block, four lower stage thermo-electric cooling elements each associated with a separate one of said faces, cold junctions to each element in good thermal contact with the associated face and a higher stage thermo-electric cooling element, having hot junctions in good thermal contact with a fifth one of said six faces.

3. A multistage thermo-electric cooling device comprising a heat transfer block, a total surface area to said block, six substantially flat faces to said block, four of said faces comprising at least 50% of said total surface area, four lower stage thermo-electric cooling elements each associated with a separate one of said four faces, cold junctions to each element in good thermal contact with the associated face and a higher stage thermo-electric cooling element having hot junctions in good thermal contact with a fifth one of said six faces.

References Cited in the file of this patent

UNITED STATES PATENTS

| | | |
|---|---|---|
| 2,734,344 | Lindenblad | Feb. 14, 1956 |
| 2,978,875 | Lackey | Apr. 11, 1961 |